United States Patent
Ohashi et al.

(10) Patent No.: US 6,545,537 B2
(45) Date of Patent: Apr. 8, 2003

(54) AUTOMATIC GAIN CONTROL CIRCUIT, AND OPTICAL RECEIVER USING THE SAME

(75) Inventors: Naomi Ohashi, Yokohama (JP); Kazuhiro Nojima, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 20 days.

(21) Appl. No.: 09/910,816

(22) Filed: Jul. 24, 2001

(65) Prior Publication Data

US 2002/0008580 A1 Jan. 24, 2002

(30) Foreign Application Priority Data

Jul. 24, 2000 (JP) .......................................... 2000-222196

(51) Int. Cl.$^7$ ................................................. H03F 3/45
(52) U.S. Cl. ................. 330/254; 330/279; 250/214 AG
(58) Field of Search ........................... 330/254, 279, 330/252; 250/214 AG

(56) References Cited

U.S. PATENT DOCUMENTS

| | | | | |
|---|---|---|---|---|
| 4,424,498 A | * | 1/1984 | Murray et al. ................. 333/18 |
| 5,015,839 A | * | 5/1991 | Tanikoshi ............. 250/214 AG |
| 5,212,983 A | * | 5/1993 | Ott et al. .................. 73/204.15 |
| 6,047,167 A | * | 4/2000 | Yamashita .................. 455/126 |
| 6,169,452 B1 | * | 1/2001 | Popescu et al. ............. 330/254 |
| 6,208,209 B1 | * | 3/2001 | Ng .............................. 330/279 |

* cited by examiner

*Primary Examiner*—Henry Choe
(74) *Attorney, Agent, or Firm*—Connolly Bove Lodge & Hutz LLP

(57) ABSTRACT

In an automatic gain control circuit comprising a variable gain amplifying circuit for amplifying an input signal through the use of variable gain control to send out an output signal and a gain control circuit for amplitude-controlling the input signal fed into the variable gain amplifying circuit, a peak detecting circuit of the variable gain amplifying circuit detects a peak voltage value of the output signal, and the gain control circuit generates an amplitude control signal corresponding to an amplitude value of the output signal. The generated amplitude control signal is fed back to the variable gain amplifying circuit for controlling the amplitude of the output signal to a constant value with respect to amplitude variations of the input signal. With this arrangement, even if a largely amplitude-varying input signal appears, the gain control circuit can control the amplitude of the output signal readily to a constant value.

7 Claims, 9 Drawing Sheets

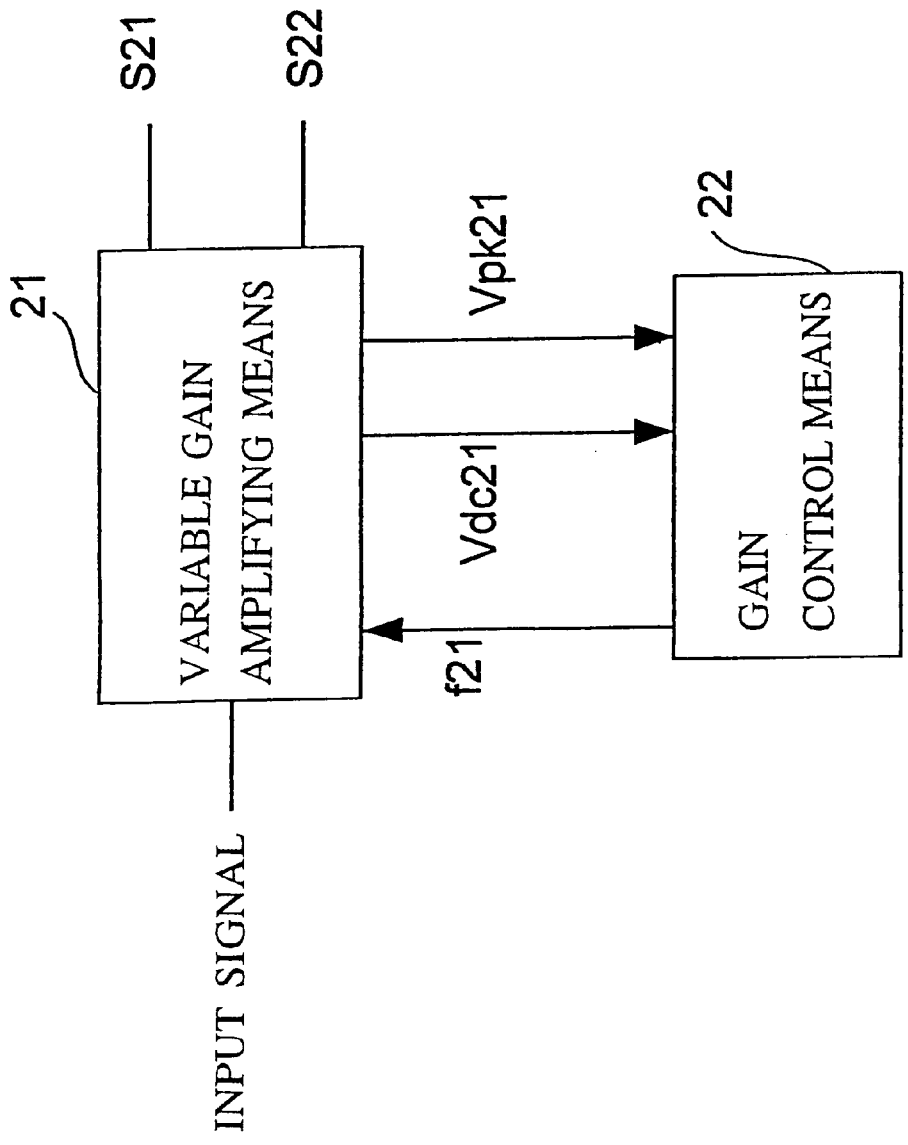
F I G. 5

AUTOMATIC GAIN CONTROL CIRCUIT, AND OPTICAL RECEIVER USING THE SAME

BACKGROUND OF THE INVENTION

1) Field of the Invention

The present invention relates to an automatic gain control circuit (which will be referred to hereinafter as an "AGC circuit") suitable for use as an amplifying means for an optical receiver, and more particularly to an AGC circuit designed to convert an amplitude varying input signal into a signal with a constant amplitude.

2) Description of the Related Art

For example, Japanese Unexamined Patent Publication (Hei) No. 8-172332 discloses an AGC circuit for use in an optical receiver, where a conversion of an amplitude varying optical input signal into a signal with a constant amplitude takes place by means of the feedback of an amplitude control signal generated on the basis of an amplitude value of an output signal. FIG. 9 is a block diagram showing an example of a configuration of a conventional AGC circuit. This AGC circuit is made up of a variable gain amplifying means 41 for amplifying an input signal through gain variations to send out the amplified signal as an output signal, an amplitude detecting means 43 for detecting an amplitude value of the input signal, and a gain control means 42 for amplitude-controlling the variable gain amplifying means 41 on the basis of the detected amplitude value.

A control method for use in this AGC circuit is such that, when the amplitude detecting means 43 detects an amplitude value of an amplitude varying signal inputted to the variable gain amplifying means 41, the gain control means 42 generates an amplitude control signal on the basis of the detected amplitude value and feeds back the generated amplitude control signal to the variable gain amplifying means 41 for accomplishing the amplitude control. This enables converting an input signal varying in amplitude into a constant amplitude signal and outputting it.

There is a problem which arises with the above-mentioned conventional AGC circuit, however, in that, when a signal with a great amplitude is inputted to the variable gain amplifying means 41, the gain control means 42 generates a large amplitude control signal to feedback-control the variable gain amplifying means 41 so that there is the tendency for the variable gain amplifying means 41 to implement gain variable control beyond intention. Accordingly, the amplitude value of an output signal can vary in conjunction with amplitude variations of an input signal within a gain variable range of the variable gain amplifying means 41. In addition, the technique disclosed in the aforesaid Japanese Unexamined Patent Publication (Hei) No. 8-172332 is made to feedback control an amplitude value of an output signal of the variable gain amplifying means 41, and the input of a large amplitude signal likewise causes variation in output signal amplitude value.

SUMMARY OF THE INVENTION

The present invention has been developed with a view to eliminating such a problem, and it is therefore an object of the invention to provide an AGC circuit capable of preventing an amplitude value of an output signal from varying in conjunction with amplitude variations of an input signal within a gain variable range of a variable gain amplifying means even at input of a signal with a great amplitude, and an optical receiver using this AGC circuit.

For this purpose, in accordance with an aspect of the present invention, there is provided an AGC circuit comprising variable gain amplifying means for amplifying an input signal through the use of variable gain control to send out an output signal and gain control means for amplitude-controlling the input signal to the variable gain amplifying means, wherein the variable gain amplifying means includes peak detecting means for detecting a peak voltage value of the output signal, and the gain control means receives the peak voltage value detected by the peak detecting means to generate an amplitude control signal corresponding to an amplitude value of the output signal for feeding back the generated amplitude control signal to the variable gain amplifying means so that the variable gain amplifying means controls the amplitude of the output signal to a constant value in response to or with respect to amplitude variations of the input signal.

That is, according to the present invention, the AGC circuit comprises the peak detecting means for detecting a peak voltage value of an output signal of the variable gain amplifying means so that the gain control means generates an amplitude control signal corresponding to an amplitude value of an output signal through the use of the peak voltage value detected by the peak detecting means to feed it back to the variable gain amplifying means, thereby controlling the gain of the variable gain amplifying means. With this control method, it is possible to increase a variation of the peak voltage value corresponding to the amplitude value of an output signal with respect to amplitude variations of an input signal to the variable gain amplifying means. Therefore, owing to easy execution of control, even if a largely amplitude-varying input signal appears, the gain control means can control the amplitude of the output signal readily to a constant value.

In addition, in the AGC circuit according to the invention, the variable gain amplifying means serves as a differential amplifying circuit, and the peak detecting means detects a peak voltage value of one of two output signals of the differential amplifying circuit.

That is, with the AGC circuit according to the invention, the gain control means utilizes a peak voltage value of one of two output signals a differential amplifier constituting the variable gain amplifying means to generate an amplitude control signal corresponding to an amplitude value of the output signal on the basis of the peak voltage value so that the generated amplitude control signal is fed back to the variable gain amplifying means for controlling the gain of the variable gain amplifying means. This can control the amplitude value of an output signal of the variable gain amplifying means to a constant value in response to an amplitude varying input signal.

Still additionally, in the AGC circuit according to the invention, the variable gain amplifying means acts as a differential amplifying circuit and the peak detecting means individually detects peak voltage values of two output signals of the differential amplifying circuit so that the gain control means acquires the two detected peak voltage values to produce an amplitude control signal corresponding to an average value of the amplitude values of the two output signals.

That is, in the AGC circuit according to the invention, the peak detecting means individually detects the peak voltage values of the two output signals of the differential amplifier constituting the variable gain amplifying means. The gain control means generates an amplitude control signal corresponding to the amplitude values of the output signals on the basis of the average value of the two peak voltage values to feed it back to the variable gain amplifying means for controlling the gain of the variable gain amplifying means. This can control the output signals of the variable gain amplifying means to constant amplitude values equal to each other.

Furthermore, in accordance with another aspect of the present invention, there is provided an AGC circuit comprising variable gain amplifying means for amplifying an input signal through the use of variable gain control to send out an output signal and gain control means for amplitude-controlling the input signal to the variable gain amplifying means, wherein the variable gain amplifying means includes peak detecting means for detecting a peak voltage value of an output signal and direct-current voltage detecting means for detecting a direct-current voltage value of the output signal while the gain control means generates an amplitude control signal corresponding to an amplitude of the output signal on the basis of a difference between the detected peak voltage value and the detected direct-current voltage value to feed back the generated amplitude control signal to the variable gain amplifying means for controlling the variable gain amplifying means so that the amplitude of the output signal becomes a constant value with respect to amplitude variations of the input signal.

That is, in the AGC circuit according to the invention, the gain control means extracts a peak voltage value detected by the peak detecting means and a direct-current voltage value detected by the direct-current voltage detecting means to generate an amplitude control signal corresponding to an amplitude value of an output signal on the basis of a difference therebetween for feeding back the generated amplitude control signal to the variable gain amplifying means, thereby controlling the gain of the variable gain amplifying means. This can control the amplitude of an output signal of the variable gain amplifying means to a constant value with respect to an amplitude varying input signal and operating temperature variations in the variable gain amplifying means.

Moreover, in the AGC. circuit according to the invention, the variable gain amplifying means acts as a differential amplifying circuit, and the peak detecting means detects a peak voltage value of one of two output signals of the differential amplifying circuit, while the direct-current voltage detecting means detects a direct-current voltage value of the output signal from which the peak detecting means detects the peak voltage value.

That is, in the AGC circuit according to the invention, the gain control means generates an amplitude control signal corresponding to an amplitude value of an output signal on the basis of a difference between a peak voltage value and output direct-current voltage value of the output signal of the variable gain amplifying means to feed it back to the variable gain amplifying means for controlling the gain of the variable gain amplifying means. This can control the amplitude of an output signal of the variable gain amplifying means to a constant value in response to an amplitude varying input signal and operating temperature variations in the variable gain amplifying means.

Still moreover, in the AGC circuit according to the invention, the variable gain amplifying means acts as a differential amplifying circuit, and the peak detecting means separately detects the peak voltage values of two output signals of the differential amplifying circuit while the direct-current voltage detecting means separately detects the direct-current voltage values of the two output signals of the differential amplifying circuit so that the gain control means generates an amplitude control signal corresponding to an amplitude of the output signal on the basis of an average value of differences each between the peak voltage value and direct-current voltage value detected on each of the output signals.

That is, in the AGC circuit according to the invention, the gain control means generates an amplitude control signal corresponding to an amplitude value of an output signal on the basis of an average value of differences between the peak voltage values and direct-current voltage values of two output signals of the variable gain amplifying means to feed it back to the variable gain amplifying means, thereby controlling the gain of the variable gain amplifying means. This can control the amplitudes of the two output signals of the variable gain amplifying means to constant values equal to each other with respect to an amplitude varying input signal and operating temperature variations in the variable gain amplifying means.

Furthermore, in accordance with the present invention, there is provided an optical receiver using an AGC circuit stated above.

BRIEF DESCRIPTION OF THE DRAWINGS

Other objects and features of the present invention will become more readily apparent from the following detailed description of the preferred embodiments taken in conjunction/with the accompanying drawings in which:

FIG. 5 is a block diagram showing an arrangement of an AGC circuit according to a third embodiment of the present invention;

DESCRIPTION OF THE PREFERRED EMBODIMENTS

Figure 1:
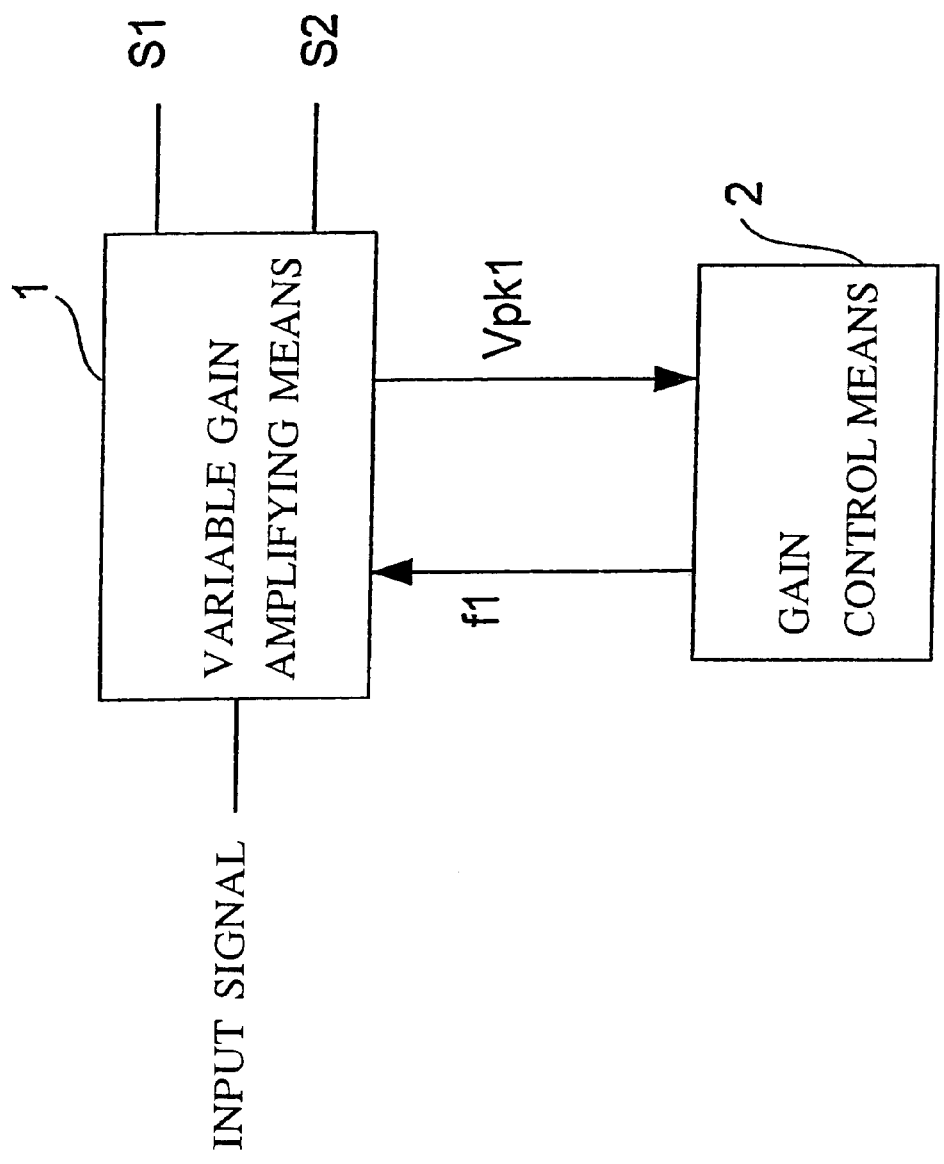
FIG. 1 is a block diagram showing an arrangement of an AGC circuit according to a first embodiment of the present invention.

Referring to the drawings, several embodiments will be described hereinbelow of AGC circuits according to the present invention.

First Embodiment

Figure 2:
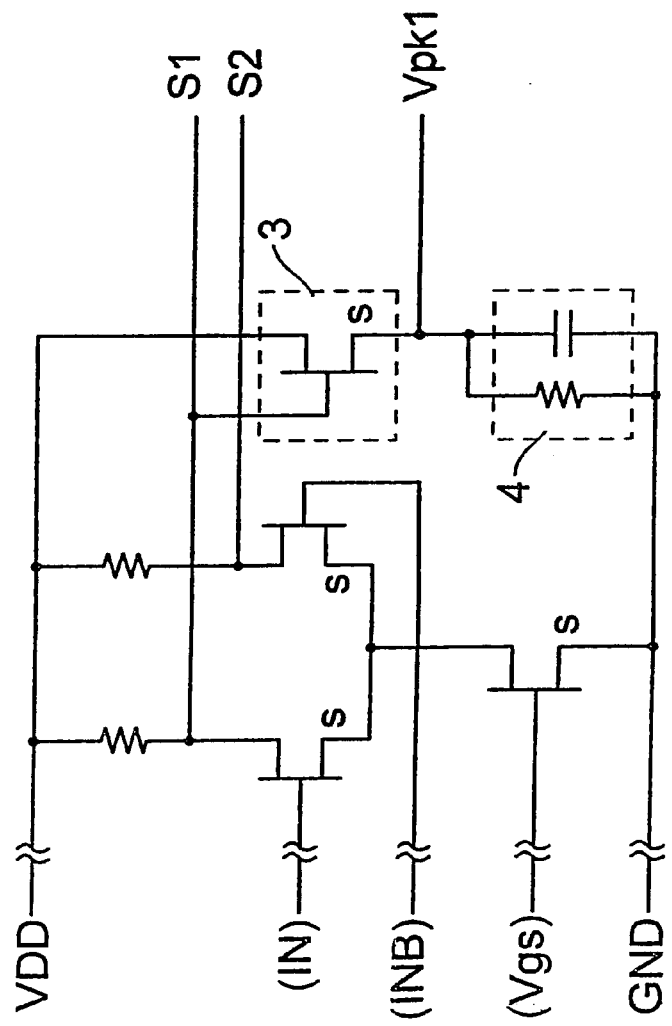
FIG. 2 is an illustration of a detailed circuit arrangement, of a variable gain amplifying means shown in FIG. 1.

First of all, a description will be given hereinbelow of an AGC circuit according to a first embodiment of the present invention. FIG. 1 is a block diagram showing an arrangement of an AGC circuit according to the first embodiment of the invention, and FIG. 2 is an illustration of a detailed circuit arrangement of a variable gain amplifying means shown in FIG. 1.

As FIG. 1 shows, this AGC circuit is made up of a variable gain amplifying means 1 for amplifying an input signal through variable gain control to generate output signals and a gain control means 2 for amplitude-controlling the variable gain amplifying means 1 on the basis of a peak detection voltage value Vpk1. The variable gain amplifying means 1 is composed of a well-known differential amplifying circuit comprising resistors and FETs, and a peak detecting circuit 3 and a low-pass filter (which will hereinafter be referred to simply as an "LPF") 4, which are placed on an output side of the differential amplifying circuit. Incidentally, the differential amplifying circuit section is an IC circuit such as an operational amplifier generally known, each part thereof is not designated at a reference numeral and the description of an operation thereof will be omitted for brevity.

In the illustrations, the variable gain amplifying means 1 outputs differential-amplified signals of an output signal S1 and an output signal S2. In this case, the peak detecting circuit 3 exists for only the output signal S1; therefore, a peak detection voltage value Vpk1 corresponding to an amplitude value of the output signal S1 is extracted through the peak detecting circuit 3.

In addition, the peak detecting circuit 3 detects only high-side values of amplitude values of the output signal S1, with the detection values being integrated in the LPF 4 and outputted therefrom. Accordingly, the peak detection voltage value Vpk1 varies in half the overall amplitude varying range of the output signal S1. That is, although the output signal S1 has an amplitude width in which amplitude varies to the high side and the low side, only values in the high-side amplitude width are outputted as a peak detection voltage value Vpk1.

Still additionally, the gain control means 2 receives the peak detection voltage value Vpk1 for generating an amplitude control signal corresponding to an amplitude value of the output signal S1. The amplitude control signal proportional to the peak detection voltage value Vpk1 is returned as a feedback signal f1 to the variable gain amplifying means 1, thereby controlling the gain of the variable gain amplifying means 1.

As described above, in the AGC circuit according to the first embodiment, since the peak detecting circuit 3 is provided on the output side of the variable gain amplifying means 1, it is possible to accurately extract a peak detection voltage value Vpk1 according to amplitude variations of the output signal S1 from the variable gain amplifying means 1. Moreover, since the peak detection voltage value Vpk1 varies in proportion to amplitude variations in only the high-side amplitude varying range which is half the overall amplitude varying range of the output signal S1 of the variable gain amplifying means 1 in which amplitude varies to the high and low sides, the amplitude control becomes easy to the gain control means 2 utilizing the peak detection voltage value Vpk1, which contributes greatly to improvement of the control accuracy. In this way, the AGC circuit can stably control the amplitude value of an output signal to a constant value in response to the amplitude variations of an input signal.

Second Embodiment

Figure 3:
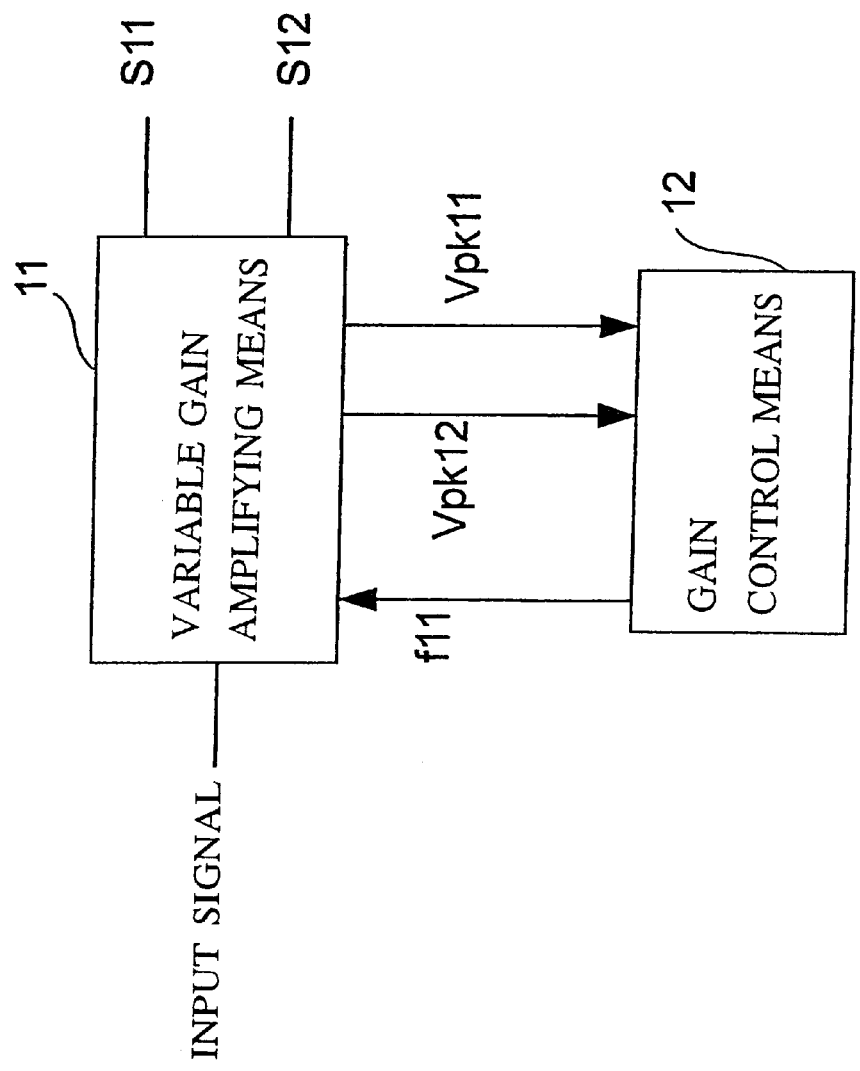
FIG. 3 is a block diagram showing an arrangement of an AGC circuit according to a second embodiment of the present invention.
Figure 4:
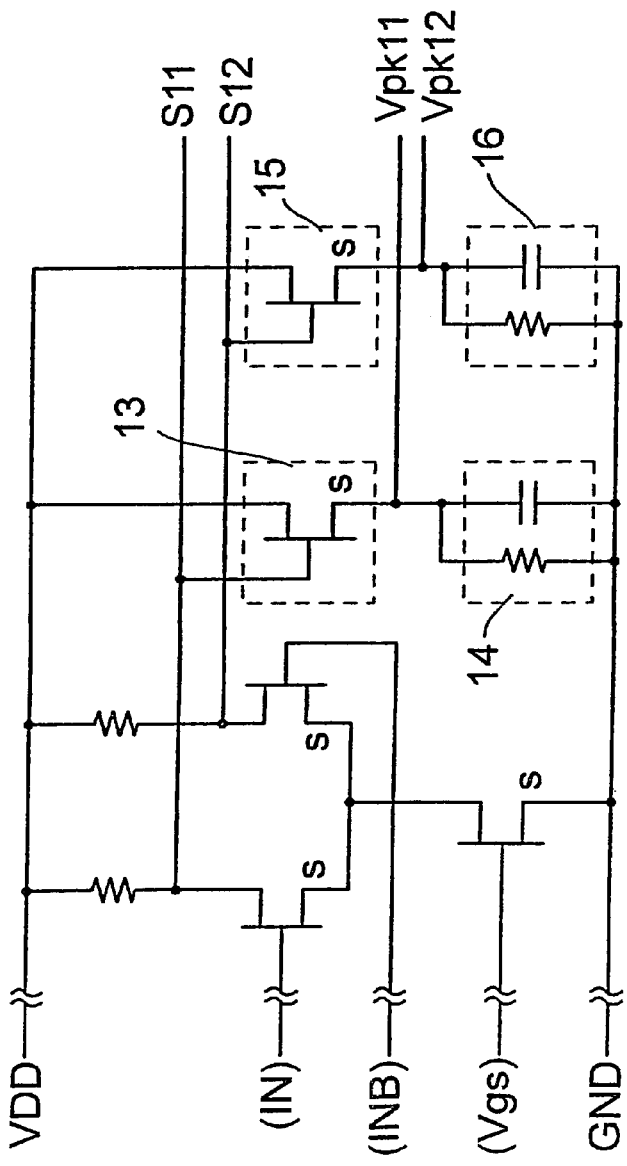
FIG. 4 is an illustration of a detailed circuit arrangement of a variable gain amplifying means shown in FIG. 3.

Secondly, a description will be given hereinbelow of an AGC circuit according to a second embodiment of the present invention. FIG. 3 is a block diagram showing an arrangement of an AGC circuit according to a second embodiment of the present invention, and FIG. 4 is an illustration of a detailed circuit arrangement of a variable gain amplifying means shown in FIG. 3.

In these illustrations, this AGC circuit is made up of a variable gain amplifying means 11 for amplifying an input signal by means of variable gain control to produce output signals, and a gain control means 12 for amplitude-controlling the variable gain amplifying means 11 on the basis of peak detection voltage values Vpk11 and Vpk12. The variable gain amplifying means 11 is composed of a well-known differential amplifying circuit comprising resistors and FETs, and a peak detecting circuit 13, an LPF 14, a peak detecting circuit 15 and an LPF 16, which are placed on the output side of the differential amplifying circuit.

In this AGC circuit, the peak detection voltage values Vpk11 and Vpk12 are extracted from two differential-amplified output signals S11 and S12 of the variable gain amplifying means 1, respectively. That is, the peak detection voltage value Vpk11 corresponding to a high-side amplitude value is extracted from the output signal S11 through the peak detecting circuit 13 and the LPF 14, while the peak detection voltage value Vpk12 corresponding to a high-side amplitude value is extracted from the output signal S12 through the peak detecting circuit 15 and the LPF 16.

In this case, the gain control means 12 extracts the peak detection voltage values Vpk11 and Vpk12 in the form of an average value of the amplitude values of the output signals S11 and S12, and generates an amplitude control signal corresponding to the amplitude values of the output signals S11 and S12 on the basis of the average value for returning a feedback signal f11 to the variable gain amplifying means 11, thereby controlling the gain of the variable gain amplifying means 11.

As described above, in the AGC circuit according to the second embodiment, a peak detecting circuit is used for each of the two output signals of the variable gain amplifying means 11, i.e., the output signals S11 and S12; therefore, it is possible to accurately obtain peak detection voltage values Vpk11 and Vpk12 according to amplitude variations of the two output signals S11 and S12 from the variable gain amplifying means 11. In addition, the gain control means 12 utilizes an average value of the peak detection voltage values Vpk11 and Vpk12, which offsets the difference in amplitude value between the two output signals S11 and S12 stemming from the differences of FETs and resistors in the variable gain amplifying means 11. In consequence, the output amplitude values of the two output signals S11 and S12 can be set at constant values equal to each other in response to amplitude variations of an input signal.

Third Embodiment

Figure 6:
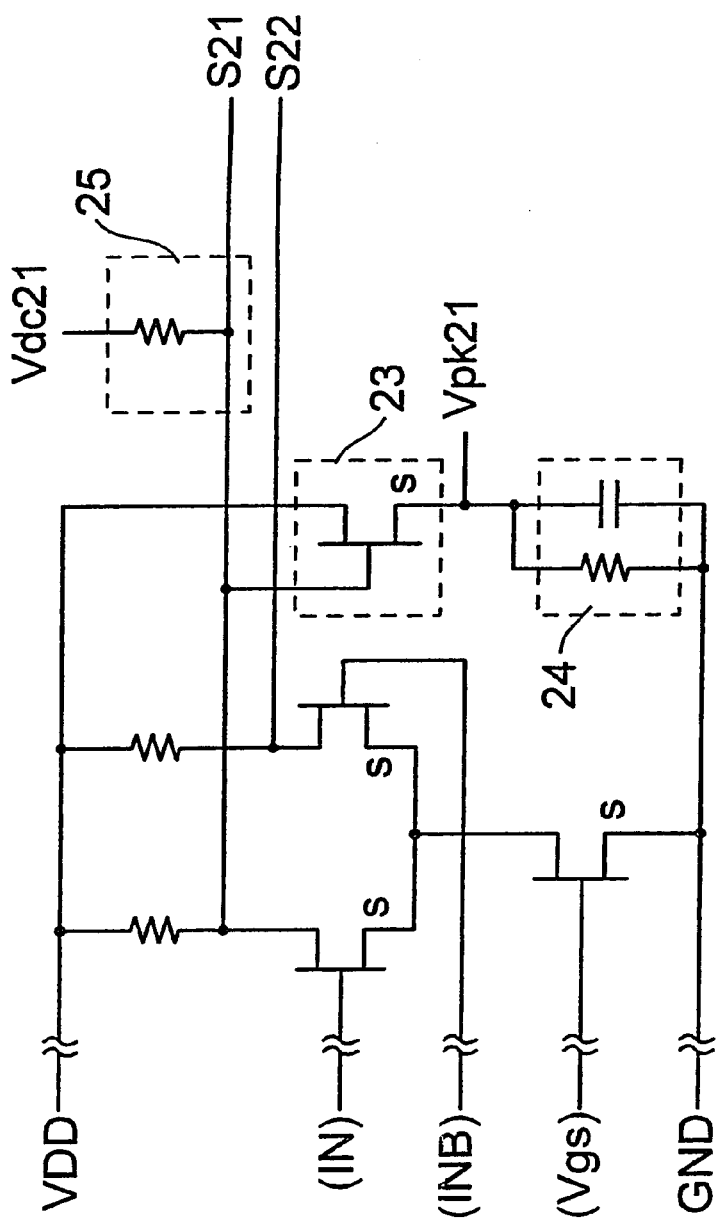
FIG. 6 is an illustration of a detailed circuit arrangement of a variable gain amplifying means shown in FIG. 5.

Furthermore, a description will be given hereinbelow of an AGC circuit according to a third embodiment of the present invention. FIG. 5 is a block diagram showing an arrangement of an AGC circuit according to a third embodiment of the present invention, and FIG. 6 is an illustration of a detailed circuit arrangement of a variable gain amplifying means shown in FIG. 5.

As shown in these illustrations, this AGC circuit is made up of a variable gain amplifying means 21 for amplifying an input signal through variable gain control to produce output signals and a gain control means 22 for amplitude-controlling the variable gain amplifying means 21 on the basis of a peak detection voltage value Vpk21 and a direct-current voltage value Vdc21. The variable gain amplifying means 21 is composed of a well-known differential amplifying circuit comprising resistors and FETs, and a peak detecting circuit 23, an LPF 24 and an output direct-current voltage detecting means 25, which are placed on the output side of the differential amplifying circuit. Thus, in this arrangement according to this embodiment, of the differential-amplified output signals from the variable gain amplifying means 21, only an output signal S21 is used as a detection signal.

That is, a peak detection voltage value Vpk21 corresponding to an amplitude value of the output signal S21 from the variable gain amplifying means 21 is extracted through the use of the peak detecting circuit 23 and the LPF 24, while a direct-current voltage value Vdc21 of the output signal S21 is acquired through the use of the output direct-current voltage detecting means 25. In addition, the gain control means 22 obtains a difference between the detected peak detection voltage value Vpk21 and the detected direct-current voltage value Vdc21 to generate an amplitude control signal corresponding to an amplitude value of the output signal S21 for returning a feedback signal f21 to the variable gain amplifying means 21, thereby controlling the gain of the variable gain amplifying means 21.

With this control, when operating temperature variation occurs in the variable gain amplifying means 21, the variations of the peak detection voltage value Vpk21 and direct-current voltage value Vdc21 extracted in the gain control means 22, caused by the temperature variation, are offset mutually. Therefore, the variation of the difference between the peak detection voltage value Vpk21 and direct-current voltage value Vdc21 extracted in the gain control means 22, due to the temperature variation, becomes smaller than the variation of the peak detection voltage value Vpk21 resulting from the temperature variation, thus reducing the drop of the control accuracy stemming from the temperature variation.

As described above, in the AGC circuit according to the third embodiment, the peak detecting circuit 23 and the output direct-current voltage detecting means 25 are provided on the output side of the variable gain amplifying means 21; therefore, it is possible to accurately obtain the peak detection voltage value Vpk21 according to amplitude variations of the output signal S21 from the variable gain amplifying means 21 and the direct-current voltage value Vdc21 of the output signal S21 therefrom. Moreover, since the gain control means 22 utilizes the difference between the peak detection voltage value Vpk21 and the direct-current voltage value Vdc21, it is possible to reduce the amplitude variation of an output signal due to the operating temperature variations around the variable gain amplifying means 21, and further to set the amplitude value of an output signal at a constant value with respect to the amplitude variations of an input signal.

Fourth Embodiment

Figure 7:
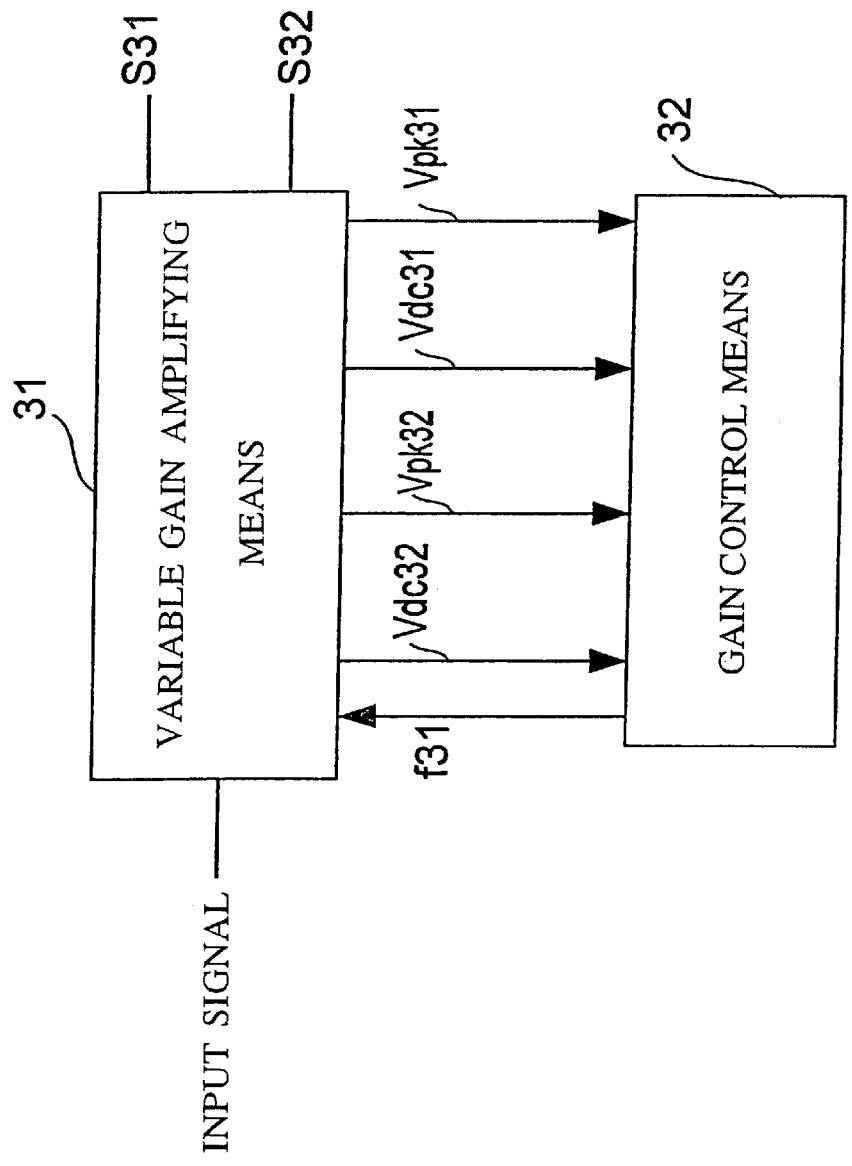
FIG. 7 is a block diagram showing an arrangement of an AGC circuit according to a fourth embodiment of the present invention.
Figure 8:
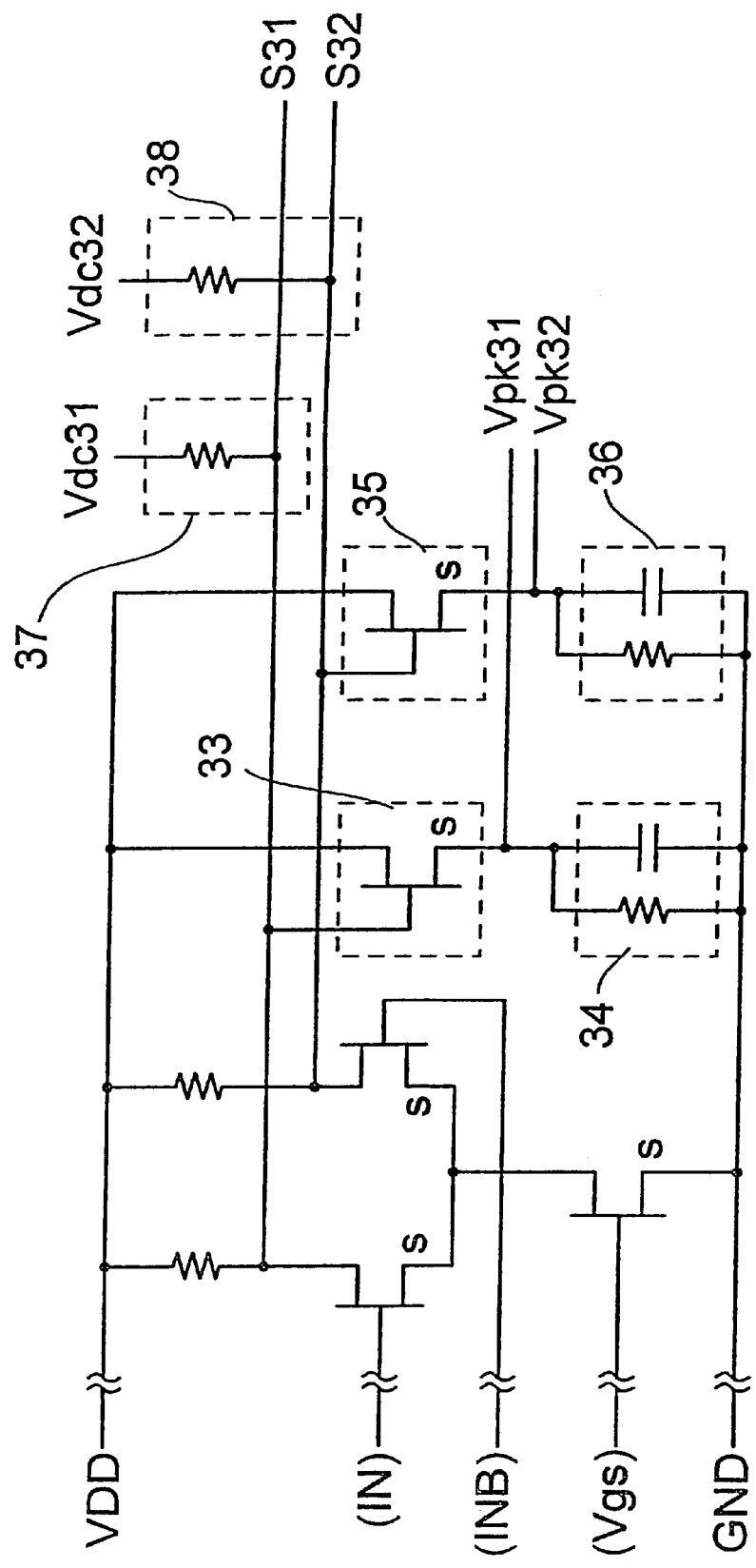
FIG. 8 is an illustration of a detailed circuit arrangement of a variable gain amplifying means shown in FIG. 7.
Figure 9:
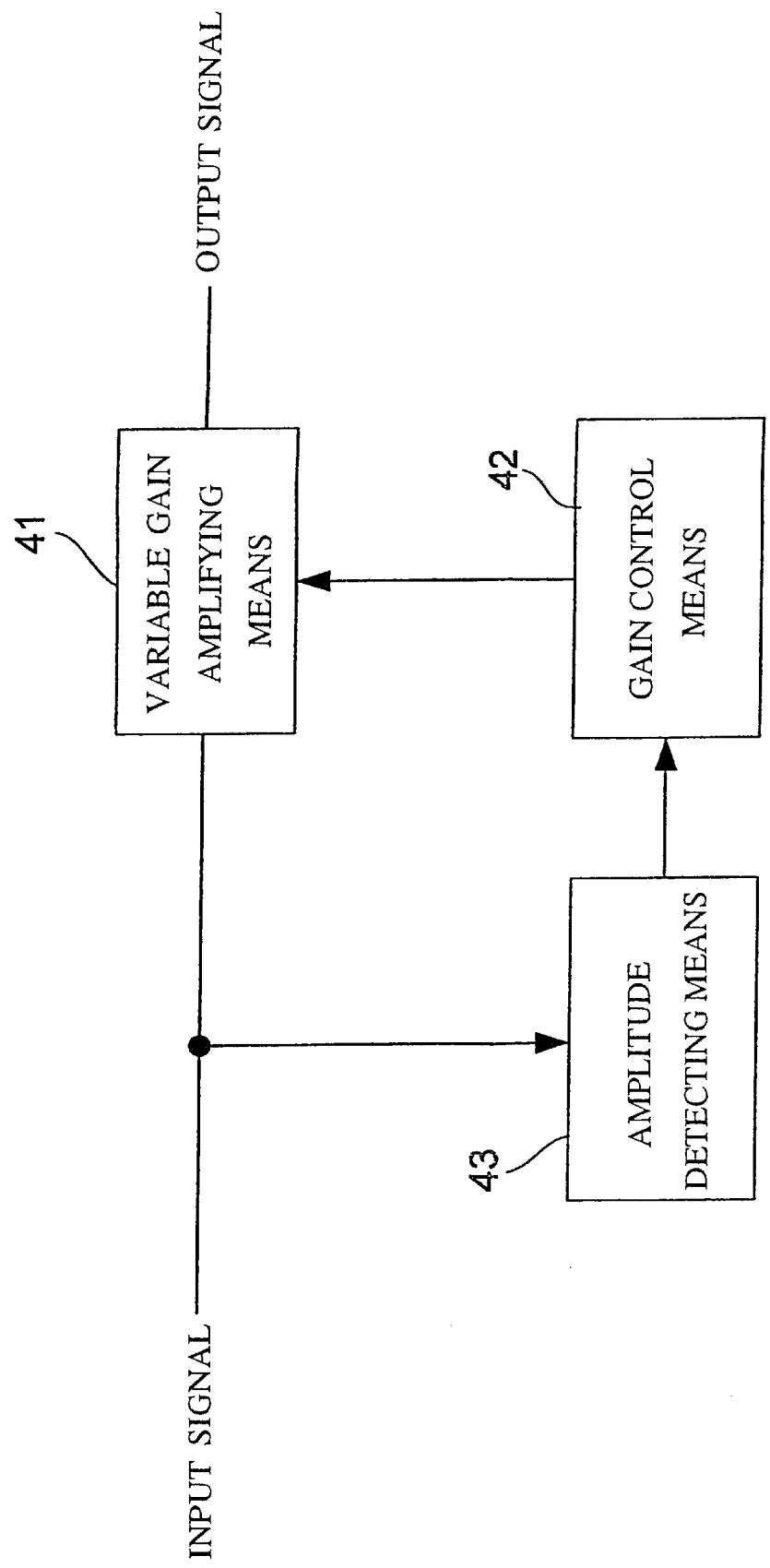
FIG. 9 is a block diagram showing an arrangement of a conventional AGC circuit.

Still furthermore, a description will be given hereinbelow of an AGC circuit according to a fourth embodiment of the present invention. FIG. 7 is a block diagram showing an arrangement of an AGC circuit according to a fourth embodiment of the present invention, and FIG. 8 is an illustration of a detailed circuit arrangement of a variable gain amplifying means shown in FIG. 7.

As shown in these illustrations, this AGC circuit is made up of a variable gain amplifying means 31 for amplifying an input signal through the use of variable gain control to generate output signals and a gain control means 32 for amplitude-controlling the variable gain amplifying means 31 on the basis of peak detection voltage values Vpk31 and Vpk32 and direct-current voltage values Vdc31 and Vdc32. The variable gain amplifying means 31 is composed of a well-known differential amplifying circuit comprising resistors and FETs, and peak detecting circuits 33, 35, LPFs 34, 36 and output direct-current voltage detecting means 37, 38, which are placed on the output side of the differential amplifying circuit. In this embodiment, both the output signals S31 and S32 of the variable gain amplifying means 21 are used as a detection signal.

That is, peak detection voltage values Vpk31 and Vpk32 corresponding to the amplitude values of the two output signals, i.e., the output signals S31 and S32, from the variable gain amplifying means 31 are extracted by a combination of the peak detecting circuit 33 and the LPF 34 and a combination of the peak detecting circuit 35 and the LPF 36, respectively. In addition, the direct-current voltage values Vdc31 and Vdc32 are extracted from the output signals S31 and S32 of the variable gain amplifying means 31 by means of the output direct-current voltage detecting means 37 and 38, respectively.

The gain control means 32 obtains a difference between the peak detection voltage value Vpk31 and the direct-current voltage value Vdc31 and a difference between the peak detection voltage value Vpk32 and the direct-current voltage value Vdc32 to calculate an average value of these differences for generate an amplitude control value corresponding to an amplitude value of the output signal by utilizing the average value, with the amplitude control signal being fed back as a feedback signal f31 to the variable gain amplifying means 31, thereby controlling the gain of the variable gain amplifying means 31.

With this control, when operating temperature variation occurs in the variable gain amplifying means 31, the variations of a difference between the peak detection voltage value Vpk31 and direct-current voltage value Vdc31 extracted in the gain control means 32 and of a difference between the peak detection voltage value Vpk32 and direct-current voltage value Vdc32 extracted therein, caused by the temperature variation, become smaller as compared with the variation of the peak detection voltage value Vpk31 or peak detection voltage value Vpk32 stemming from the temperature variation, which lessens the drop of the control accuracy resulting from the temperature variations. In addition, owing to the utilization of an average value of a difference between the peak detection voltage value Vpk31 and the direct-current voltage value Vdc31 and a difference between the peak detection voltage value Vpk32 and the direct-current voltage value Vdc32, it is possible to make the amplitude values of the two output signals S31 and S32 of the variable gain amplifying means 31 equal to each other.

As described above, in the fourth embodiment, the peak detecting circuits 33, 35 and the output direct-current voltage detecting means 37, 38 are used for the two output signals S31 and S32 of the variable gain amplifying means 31; therefore, it is possible to accurately acquire the peak detection voltage values according to the amplitude variations of the two output signals S31 and S32 of the variable gain amplifying means 31. In addition, because of obtaining the difference between the peak detection voltage value Vpk31 and the direct-current voltage value Vdc31 and the difference between the peak detection voltage value Vpk32 and the direct-current voltage value Vdc32 to utilize the average value of these differences in the gain control means 32, it is possible to reduce the variation of the output amplitude stemming from the operating temperature variation around the variable gain amplifying means 31, and further to offset the difference between the amplitude values of the two output signals S31 and S32 resulting from the differences between the FETs in the variable gain amplifying means 31, thus setting the output amplitude values of the two output signals S31 and S32 with respect to the amplitude variations of the input signal.

As stated above with the embodiments, in the AGC circuit according to the present invention, a peak detecting circuit detects a peak voltage value of an output signal of a variable gain amplifying means and a gain control means generates an amplitude control signal corresponding to an amplitude value of the output signal on the basis of the detected peak voltage value to feed back the generated amplitude control signal to the variable gain amplifying means for controlling the gain of the variable gain amplifying means. Accordingly, it is possible to control the amplitude of the output signal even if an input signal to the variable gain amplifying means shows great amplitude variation. In this case, irrespective of whether the gain control means detects a peak voltage value of one of the output signals of the variable gain amplifying means or peak voltage values of two of the output signals thereof, it is possible to similarly control the amplitude value of the output signal to a constant value.

In addition, in the AGC circuit according to the present invention, the gain control means utilizes a peak voltage value of an output signal detected by a peak detecting circuit and a direct-current voltage value of the output signal detected by a direct-current voltage detecting means to generate an amplitude control signal corresponding to an amplitude value of the output signal on the basis of a difference between the peak voltage value and the direct-current voltage value for feeding back the generated amplitude control signal to the variable gain amplifying means, thereby controlling the gain of the variable gain amplifying means. Accordingly, it is possible to control the amplitude of the output signal to a constant value with respect to an amplitude varying input signal, and further to control the amplitude of the output signal to a constant value irrespective of operating temperature variation of the variable gain amplifying means. In this case, irrespective of whether the gain control means detects a peak voltage value and direct-current voltage value of one of the output signals of the variable gain amplifying means or peak voltage values and direct-current values of two of the output signals thereof, similar effects are attainable.

It should be understood that the present invention is not limited to the above-described embodiments, and that it is intended to cover all changes and modifications of the embodiments of the invention herein which do not constitute departures from the spirit and scope of the invention.

What is claimed is:

1. An automatic gain control circuit comprising:
   variable gain amplifying means for amplifying an input signal through the use of variable gain control to send out an output signal; and
   gain control means for amplitude-controlling said input signal fed into said variable gain amplifying means, said variable gain amplifying means including:
      peak detecting means for detecting a peak voltage value of said output signal; and
      direct-current voltage detecting means for detecting a direct-current voltage value of said output signal,
   said gain control means generating an amplitude control signal corresponding to an amplitude of said output signal on the basis of a difference between said peak voltage value detected by said peak detecting means and said direct-current voltage value detected by said direct-current voltage detecting means to feed back the generated amplitude control signal to said variable gain amplifying means for controlling said variable gain amplifying means so that said amplitude of said output signal becomes a constant value with respect to amplitude variations of said input signal.

2. The automatic gain control circuit according to claim 1, wherein said variable gain amplifying means is a differential amplifying circuit, and said peak detecting means detects a peak voltage value of one of two output signals of said differential amplifying circuit, while said direct-current voltage detecting means detects a direct-current voltage value of said output signal from which said peak detecting means detects said peak voltage value.

3. The automatic gain control circuit according to claim 1 wherein said variable gain amplifying means is a differential amplifying circuit, and said peak detecting means separately detects peak voltage values of two output signals of said differential amplifying circuit while said direct-current voltage detecting means separately detects direct-current voltage values of said two output signals of said differential amplifying circuit, with said gain control means generating an amplitude control signal corresponding to amplitudes of said output signals on the basis of an average value of differences each between said peak voltage value and direct-current voltage value detected on each of said output signals.

4. The automatic gain control circuit according to claim 1, wherein said peak detecting means obtains said peak voltage value of said output signal from a higher half side of an amplitude varying range of said output signal.

5. An optical receiver using an automatic gain control circuit for converting an amplitude varying optical signal into an output signal with a constant amplitude, said automatic gain control circuit comprising:
   variable gain amplifying means for amplifying an input signal through the use of variable gain control to send out an output signal; and
   gain control means for amplitude-controlling said input signal fed into said variable gain amplifying means, said variable gain amplifying means including:
      peak detecting means for detecting a peak voltage value of said output signal; and
      direct-current voltage detecting means for detecting a direct-current voltage value of said output signal,
   said gain control means generating an amplitude control signal corresponding to an amplitude of said output signal on the basis of a difference between said peak voltage value detected by said peak detecting means and said direct-current voltage value detected by said direct-current voltage detecting means to feed back the generated amplitude control signal to said variable gain amplifying means for controlling said variable gain amplifying means so that said amplitude of said output signal becomes a constant value with respect to amplitude variations of said input signal.

6. The optical receiver according to claim 5, wherein said variable gain amplifying means is a differential amplifying circuit, and said peak detecting means detects a peak voltage value of one of two output signals of said differential amplifying circuit, while said direct-current voltage detecting means detects a direct-current voltage value of said output signal from which said peak detecting means detects said peak voltage value.

7. The optical receiver according to claim 5, wherein said variable gain amplifying means is a differential amplifying circuit, and said peak detecting means separately detects peak voltage values of two output signals of said differential amplifying circuit while said direct-current voltage detecting means separately detects direct-current voltage values of said two output signals of said differential amplifying circuit, with said gain control means generating an amplitude control signal corresponding to amplitudes of said output signals on the basis of an average value of differences each between said peak voltage value and direct-current voltage value detected on each of said output signals.

* * * * *